United States Patent [19]

Miller

[11] Patent Number: 4,794,019

[45] Date of Patent: Dec. 27, 1988

[54] REFRACTORY METAL DEPOSITION PROCESS

[75] Inventor: Nicholas E. Miller, Cupertino, Calif.

[73] Assignee: Applied Materials, Inc., Santa Clara, Calif.

[21] Appl. No.: 115,579

[22] Filed: Oct. 22, 1987

Related U.S. Application Data

[63] Continuation of Ser. No. 915,905, Oct. 6, 1986, abandoned, which is a continuation of Ser. No. 774,190, Sep. 9, 1985, abandoned, which is a continuation of Ser. No. 183,974, Sep. 4, 1980, abandoned.

[51] Int. Cl.$^4$ .............................................. B05D 5/12
[52] U.S. Cl. ...................................... 427/124; 427/79;
427/126.1; 427/126.3; 427/253; 427/255.1;
427/265; 427/294; 427/404; 427/419.2;
427/419.7
[58] Field of Search ...................... 427/79, 124, 126.1,
427/126.3, 253, 255.1, 265, 294, 404, 419.2,
419.7

[56] References Cited

U.S. PATENT DOCUMENTS

| 3,373,018 | 3/1968 | Oxley et al. | 427/253 X |
|---|---|---|---|
| 3,519,479 | 7/1970 | Inoue et al. | 427/91 X |
| 4,517,225 | 5/1985 | Broadbent | 427/91 |

FOREIGN PATENT DOCUMENTS

| 2718518 | 7/1980 | Fed. Rep. of Germany . |
| 114350 | 10/1978 | Japan . |
| 1330720 | 9/1973 | United Kingdom . |

OTHER PUBLICATIONS

Powell et al "Vapor Deposition", John Wiley & Sons, pp. 308-309 1966.
Wahl et al, "The CVD of Fluoride Tungsten Measurements and Thermodynamic Calculations", *CVD 4th Int. Conf.*, Electrochemical Society, Inc. Princeton, N.J. 1973 pp. 425-438.
Powell et al, *Vapor Deposition*, Electrochemical Society, NY, N.Y, Wiley & Sons Inc. 1966 p. 687.

*Primary Examiner*—Bernard Pianalto
*Attorney, Agent, or Firm*—Flehr, Hohbach, Test, Albritton & Herbert

[57] ABSTRACT

Process for depositing tungsten or other refractory metals on semiconductor devices by a reaction of a gas containing the metal in a vapor deposition reactor. The reaction occurs at relatively low temperature (240°–400° C.) and pressure (0.1–10 torr), and the resulting film adheres differently to different substrate materials. Patterned coatings can be made without the patterning steps which are required with prior art techniques.

8 Claims, 1 Drawing Sheet

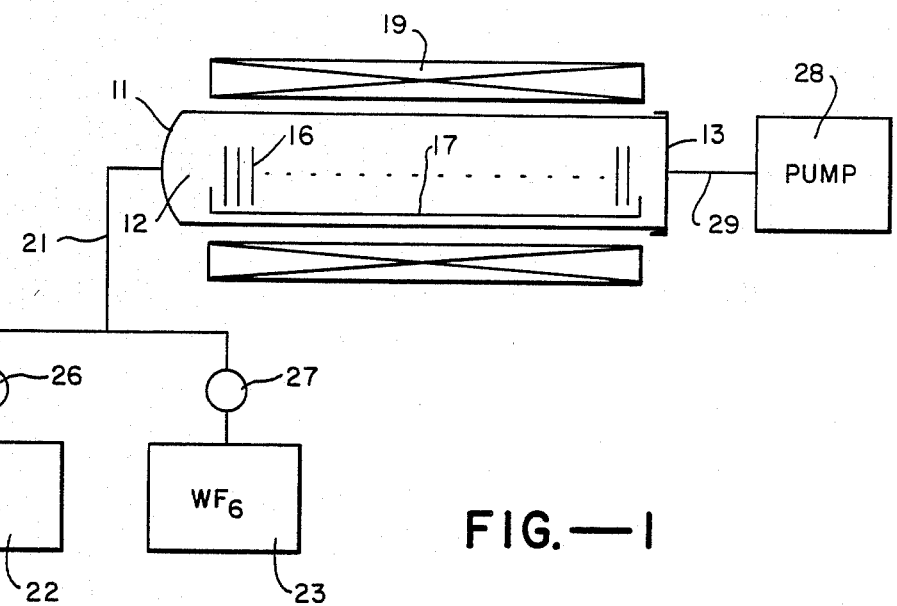
FIG.—1
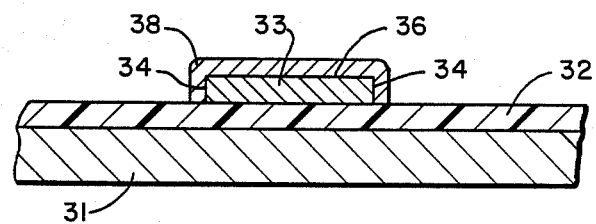
FIG.—2
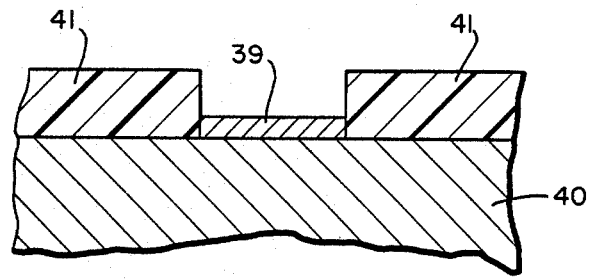
FIG.—3

REFRACTORY METAL DEPOSITION PROCESS

This is a continuation of application Ser. No. 915,905 filed Oct. 6, 1986, a continuation of Ser. No. 774,190, filed Sept. 9, 1985, a continuation of Ser. No. 183,974, filed Sept. 4, 1980 which are all abandoned.

This invention pertains generally to the metallization of semiconductor devices and more particularly to a chemical vapor deposition process for depositing tungsten or another refractory metal in the fabrication of semiconductor devices.

Metal films are used in the fabrication of semiconductor devices. These films serve as low resistance interconnections within the devices. Aluminum might be used to connect a gate to a capacitor in an MOS device or aluminum might be used to connect an emitter to a resistor in a bipolar device. Aluminum and doped polycrystalline silicon are currently the two most commonly used interconnecting films in the semiconductor industry. However, both materials have certain undesirable limitations. Aluminum has a low melting point, and alloys with silicon at a temperature of less than 500° C. This limits the temperature of processes which may be used after the aluminum is deposited to less than 500° C. Also, aluminum tends to diffuse rapidly or "spike" into silicon contacts. Aluminum is normally deposited by direct flight of atoms to the irregular device surface and this leads to incomplete step coverage. Polycrystalline silicon deposited by chemical vapor deposition (CVD), overcomes many of the deficiencies of aluminum. However, polycrystalline silicon (polysilicon), even when heavily doped by atoms which promote electrical conduction, has a high resistivity. This high resistivity (about a factor of 100 times greater than that of aluminum) greatly limits device speed and currently limits the development of higher density semiconductor devices.

Refractory metals are very desirable materials for interconnect films in semiconductor devices. Refractory metals have high melting points compared with aluminum and have low resistivities compared with polycrystalline silicon. Refractory metal films are also useful as barrier layers and as gates. The most common methods for depositing refractory metals are by RF or Magnetron sputtering. Refractory metal films deposited by these methods are not satisfactory for most semiconductor applications. Refractory metal films deposited by sputtering have one or more of the following limitations: (1) Such films are frequently highly stressed and crack; (2) These films are characterized by relatively poor step coverage; or (3) Such films are relatively costly to produce. Sputtering equipment is expensive both to purchase and to operate and only a relatively small number of wafers can be coated in a given amount of time in this type of equipment.

Chemical vapor deposition of refractory metals is a means of producing films which are free from most of the limitations associated with sputtering. CVD refractory metal films display excellent step coverage and can be deposited with low stress levels and with no cracking or adhesion problems. However, with current CVD techniques, only a limited number of wafers can be processed at a time. With current CVD processes, the refractory metal tends to deposit on all exposed, heated surfaces on the semiconductor device wafer, e.g. silicon, $SiO_2$ and $Si_3N_4$. In order to form a pattern of refractory metal, a metal coating is deposited on the entire wafer, then patterning steps are employed to remove the metal from all but the desired areas. The patterning steps add significantly to the overall cost and complexity of fabricating the devices.

It is in general an object of the invention to provide a new and improved process for forming a coating of tungsten or other refractory metal in the fabrication of semiconductor devices.

Another object of the invention is to provide a proces of the above character in which an adherent coating on the refractory metal is selectively deposited on silicon and certain other materials but not oh materials such as $SiO_2$ and $Si_3N_4$.

Another object of the invention is to provide a process of the above character in which patterns of refractory metal can be deposited without the conventional patterning steps of the pior art.

Another object of the invention is to provide a process of the above character which results in an improved product in which a structure is produced which has a uniform layer of refractory metal deposited on the sides and top of a polysilicon pattern on a wafer. The structure is distinguished by having substantially equal thickness of refractory metal deposited on the top and side walls o the silicon.

Another object of the invention is to provide a pocess of the above character in which a layer of refractory metal is deposited on a layer of silicon so that a refractory metal silicide is formed by a subsequent heat treatment.

These and other objects are achieved in accordance with the invention by effectin a reduction of a gas containing the refractory metal at a relatively low temperature (e.g. 220°–400° C.) and pressure (e.g. 0.1–10 torr ) in a reactor. The coating formed by this process has been found to deposit more readily on some materials than on Others, and by proper choice of substrate materials, it is possible to effect a selective coating of certain portions of the wafer. In addition, interconnecting films formed over silicon patterns by this process have exceptionally uniform thickness along both the sides and tops of the strips.

BRIEF DESCRIPTION OF THE DRAWING

FIG. 1 is a schematic drawing of one embodiment of a vapor deposition reactor for carrying out the process of the invention.

FIGS. 2 and 3 are enlarged cross-sectional views of embodiments of sections of a silicon wafer having an interconnecting refractory metal film formed in accordance with the invention.

DETAILED DESCRIPTION OF THE DRAWING

As illustrated in FIG. 1, the reactor comprises an elongated quartz tube 11 of generally circular cross-section which defines a reaction chamber 12. A removable cap or closure 13 provides access to the chamber at one end of the tube for the insertion and removal of wafers to be processed. In one presently preferred embodiment, the tube has a diameter on the order of 4–6 inches add a length on the order of 6 feet. Wafers 16 are held in the reactor by a quartz holder or boat 17 of conventional design. The wafers are supported by thin slots in a quartz boat with their surfaces perpendicular to the axis of the chamber and are spaced on the order of 3/16th to ½ inch between adjacent wafers.

An electrical resistance heating coil 19 is positioned coaxially around the reactor tube outside the reaction chamber. This coil is energized by a suitable source of electical energy (not shown) to heat the tube and the interior of the reactor chamber. The temperature is sensed in the vicinity of the heating element and a signal is provided to a control curcuit which governs the power supplied to maintain the temperature at a substantially constant level.

Gas is supplied to the reactor chamber through an inlet line 21 from sources 22, 23 through flow control valves 26, 27. An exhaust pump 28 is connected to the chamber through an outlet line 29.

According to the invention, wafers 16 are placed in the reactor and heated to a temperature on the order of 300° C. Thereafter, a hydrogen flow is initiated from source 22 at a rate on the order of 1 standard liter per minute (slm), and the pressure within the chamber is adjusted to a level on the order of 0.5 torr. $WF_6$ gas flowing from source 23 at a rate on the order of 100 standard cubic centimeters per minute (sccm) is then combined with the hydrogen, and the resulting gas mixture is admitted to the chamber.

At the outset of the $WF_6$ flow, an initil layer of tungsten is believed to be deposited on the wafers by silicon/hydrogen reduction of the $WF_6$. Once an initial layer of tungsten is deposited, additional tungsten is deposite by a hydrogen reduction of the $WF_6$. The tungsten is deposited at an average rate on the order of 50-100 Angstroms/minute by this process. The gas flow is continued for a time on the order of 20 minutes in order to deposit a 1200 to 2000 Angstrom film of tungsten on the wafers. Deposition rate decreases with time to reach a stable value of 25 Å/min at a thickness of about 3,000 Å. When the desired amount of tungsten has been deposited the $WF_6$ flow is discontinued, and the $H_2$ flow is continued for about 2-3 minutes more in order o purge the $WF_6$ gas from the chamber. Thereafter, the $H_2$ flow is discontinued, and the chamber is purged with nitrogen or an inert gas. The chamber is then brought up to atmospheric pressure by the addition of nitrogen or inert gas and the wafers are removed.

In the foregoing example, the temperatur within the chamber was maintained at a level on the order of 300° C. throughout the deposition proces, and the pressure was maintained at a level on the order of 0.5 torr. However, satisfactory results can also be obtained with temperatures ranging from about 220° C. to about 400° C. Likewise, the pressure can range from about 0.1 to about 10 torr.

It has been found that tungsten deposited within narrower ranges of temperatures and pressures, (270°-330° C. and 0.1-1.0 torr.) tends to deposit more readily on some substrate materials than on thers. More specifically, the tungsten deposit and adheres well to silicon, aluminum and other metals, including tungsten, but not on silicon dioxide, silicon nitride, or oxinitride. Aherent deposits are formed on every type of silicon, including single crystal silicon, polycrystalline silicon, doped silcon, undoped silicon, P-type silicon and N-type silicon. Tungsten is not deposited on $SiO_2$ or $Si_3N_4$ by this proess.

The tendency of the deposited metal to deposit more readily on certain materials makes it possible to deposit the metal selectively on certain areas of a wafer. ne example of this selective deposition technique is illstrated in FIG. 2. In that figure a silicon substrate 31 has a layer 32 of $SiO_2$, or $Si_3N_4$ or silicon oxinitride formed on one surface thereof. A layer of polycrystalline silicon is deposited and patterned by known conventional techniques. A strip of polycrystalline silicon 33 of generally rectangular cross-section is thus formed atop the $SiO_2$ or $Si_3N_4$ layer, with side surfaces 34 and a top surface 36 projecting outwardly from the oxide or nitride film covering the substrate. The wafer is placed in the reaction chamber and coated with tungsten in the manner and by the process described above. When the deposition process is completed, the wafer is removed from the reactor. The tungsten deposits selectively on the silicon but not on the $SiO_2$ or $Si_3N_4$, leaving a cap or film 38 of tungsten on the silicon strip. The film covers both the sides and the top of the silicon strip and is of substantially uniform thickness and resistivity throughout. This film sandwich makes an excellent low resistance gate material for MOS devices, and an excellent interconnecting film for bipolar devices. With prior tungsten coating techniques such as sputtering, it has not been possible to form a cap of uniform thickness on the top and sides of a silicon strip.

By the process described above it is possible to produce a coating 39 upon the silicon or polysilicon 40 exposed at the bottom of a contact window (FIG. 3) defined by an opening in an oxide or nitride film 41. With the process described above, it is also possible to deposit tungsten or other refractory metals (39) in narrower contact windows than has heretofore been possible. With windows havig a width less than about 3 times their depth, it is difficult by the known sputtering techniques to deposit the refractory metal uniformly into the contact window. With the process described above, however, contacts have been successfully formed in windows as narrow as 2 microns wide in oxide one micron thick and it may be possible to produce coating of the base of even narrower contact windows. Also, because of the selective characteristic of this self-aligned process, no photomask alignment or etch step is required. This avoids a process step critically sensitive to small aiignment errors and results in lower cost processing compared to the known techniques of depositing and patterning films for barrier layers at contact windows.

Tungsten deposited in accordance with the invention has a sheet resistance, typically 1.5 ohm/square for a 1500 Angstrom thick film.

Although the invention has been described with specific reference to the deposition of tungsten, it is also applicable to other refractory metals such as molybdenum and rhenium by reduction of a hexaflouride gas containing the desired metal.

The invention has a number of important features and advantages. It provides a refractory metal coating of good uniformity and smoothness which can be selectively applied to different materials commonly used in the fabrication of semiconductor devices. A relatively large number of wafers (e.g. 50 or more) can be processed simultaneously, with relatively uniform coating ($\pm 10\%$) on all of the wafers. Interconnecting films are readily formed by selectively depositing the metal over a substrate containing a suitable pattern of polysilicon.

It is apparent from the foregoing that a new and improved refractory metal deposition process ad product have been provided. While only certain presently preferred embodiments have been described in detail, as will be apparent to those familiar with the art, certain changes and modifications such as use of alternative methods of supplying heat the maintaining temperatures can be made without departing from the invention as defined by the following claims.

I claim:

1. In a process for selectively forming a refractory metal coating on a pattern metal in the presence of another material as an oxide, nitride or oxynitride on a semiconductor substrate, exposing both the pattern metal and the other material to a gas containing a fluoride of the refractory metal and a reducing agent at a temperature on the order of 220°–400° C. and a pressure on the order of 0.1–1.0 torr to deposit an adherent coating of the refractory metal on the pattern metal but not on the other material.

2. The process of claim 1 wherein the gas comprises one part of the refractory metal fluoride and at least one part hydrogen.

3. The process of claim 2 wherein the temperature is maintained at a level on the order of 270°–330° C.

4. The process of claim 1 wherein the pressure is maintained at a level on the order of 0.5 torr.

5. The process of claim 1 wherein the pattern metal is aluminum.

6. The process of claim 1 wherein the pattern metal is a refractory metal.

7. The process of claim 1 wherein the refractory metal coating is tungsten.

8. In a process for selectively forming a tungsten metal coating on a pattern metal in the presence of another material such as an oxide, nitride or oxynitride on a semiconductor substrate, exposing both the pattern metal and the other material to a gas containing at least one part $WF_6$ and at least one part $H_2$ at a temperature on the order of 270°–330° C. and a pressure on the order of 0.1–1.0 torr to deposit an adherent coating of tungsten on the pattern metal but not on the other material.

* * * * *